United States Patent
Lambert

(10) Patent No.: US 11,815,395 B1
(45) Date of Patent: Nov. 14, 2023

(54) HIGH-DYNAMIC OPTICAL POWER METER COMPRISING PLURAL TRANSIMPEDANCE OPERATIONAL AMPLIFIERS, A BOOTSTRAP CIRCUIT TO SUPPRESS A VOLTAGE ACROSS A PHOTODIODE DETECTOR AND A COMPENSATION CIRCUIT

(71) Applicant: EXFO Optics, SAS, Lannion (FR)

(72) Inventor: Xavier Lambert, Trebeurden (FR)

(73) Assignee: EXFO Optics, SAS, Lannion (FR)

( * ) Notice: Subject to any disclaimer, the term of this patent is extended or adjusted under 35 U.S.C. 154(b) by 0 days.

(21) Appl. No.: 18/118,791

(22) Filed: Mar. 8, 2023

Related U.S. Application Data

(60) Provisional application No. 63/320,802, filed on Mar. 17, 2022.

(51) Int. Cl.
*G01J 1/44* (2006.01)
*H03F 3/45* (2006.01)

(52) U.S. Cl.
CPC ............ *G01J 1/44* (2013.01); *H03F 3/45475* (2013.01); *G01J 2001/446* (2013.01)

(58) Field of Classification Search
CPC ........ G01J 1/00; G01J 1/02; G01J 1/42; G01J 1/16; G01J 1/44; H03G 1/00; H03F 1/52; H03F 1/56; H03F 3/08
USPC .......................................... 250/214 R, 214.1
See application file for complete search history.

(56) References Cited

U.S. PATENT DOCUMENTS

| | | | |
|---|---|---|---|
| 4,535,233 A | 8/1985 | Abraham | |
| 6,707,025 B2 | 3/2004 | Azary et al. | |
| 7,167,655 B2 | 1/2007 | Olivier | |
| 2018/0026597 A1* | 1/2018 | Barabas | .................. H03G 3/30 330/308 |
| 2020/0200602 A1 | 6/2020 | Lee | |

OTHER PUBLICATIONS

Chris Francis, Improving transimpedance amplifiers with a bootstrap, Apr. 26, 2021, [retrieved on Sep. 9, 2021]. Retrieved from the Internet <URL: https://www.analogictips.com/improving-transimpedance-amplifiers-bootstrap/>.

* cited by examiner

*Primary Examiner* — Que Tan Le
(74) *Attorney, Agent, or Firm* — Baratta Law PLLC; Lawrence A. Baratta, Jr.

(57) ABSTRACT

There is proposed an optical power measurement circuit and an optical power meter which use a linear amplification circuit based on multiple transimpedance operational amplification lanes and which add a bootstrap circuit and a compensator circuit. 1) The bootstrap is used to reduce the effect of the photodiode capacitance and increases the amplifier's bandwidth. 2) The compensator circuit monitors the photodiode's voltage and reproduces its transient distortions, to then subtract it from the output and thereby reduce the measurement error.

12 Claims, 15 Drawing Sheets

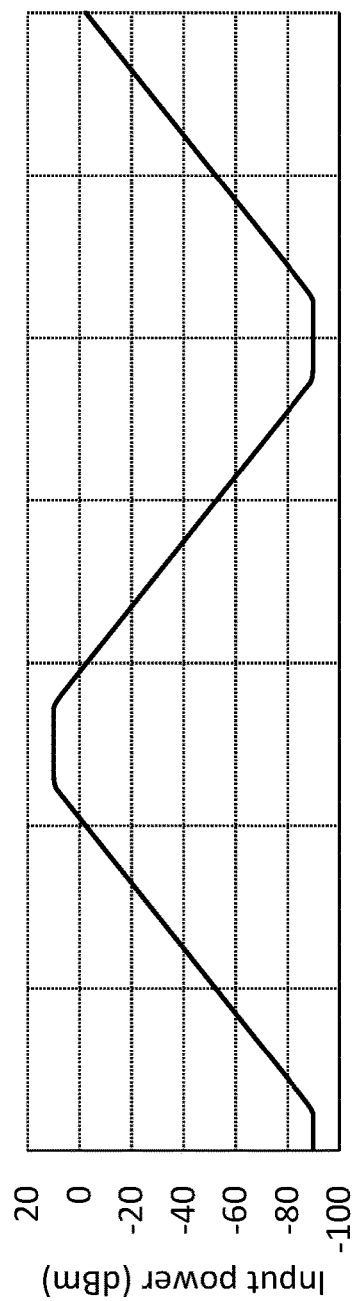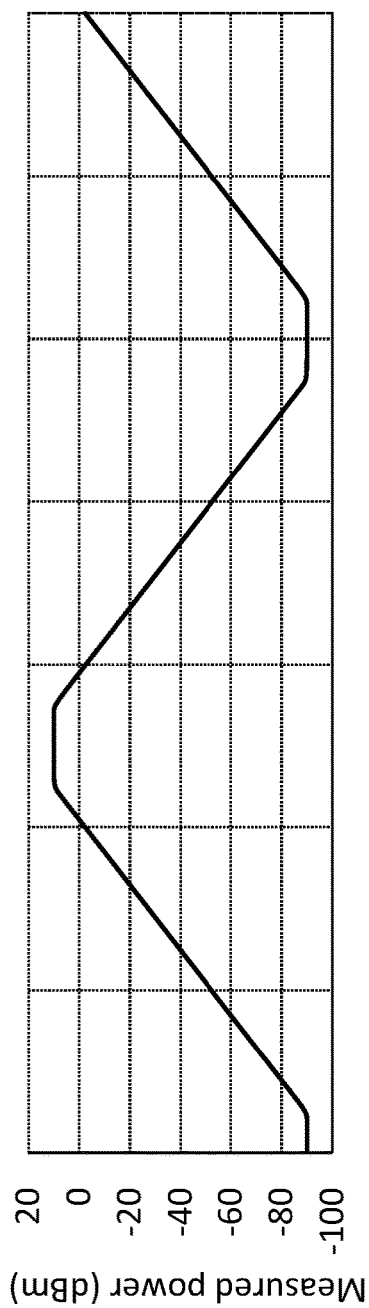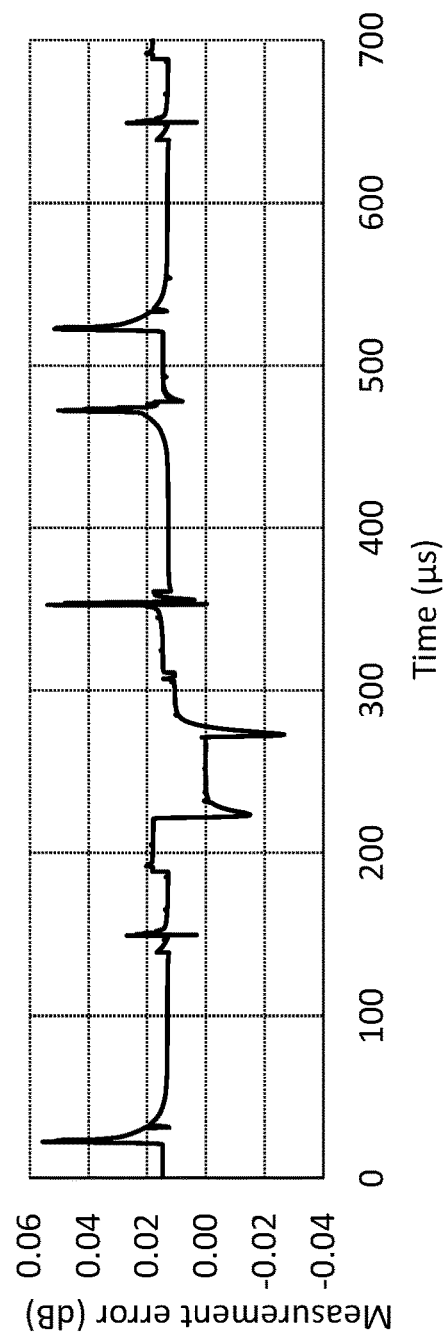
Fig. 11A
Fig. 11B
Fig. 11C

HIGH-DYNAMIC OPTICAL POWER METER COMPRISING PLURAL TRANSIMPEDANCE OPERATIONAL AMPLIFIERS, A BOOTSTRAP CIRCUIT TO SUPPRESS A VOLTAGE ACROSS A PHOTODIODE DETECTOR AND A COMPENSATION CIRCUIT

TECHNICAL FIELD

The present description generally relates to optical power measurement circuits, and more particularly to multi-scale optical power measurement circuits.

BACKGROUND

Optical component testing, and especially passive optical component testing, requires very fast and high-dynamic optical power acquisitions. For example, when characterizing an optical component, the optical power needs to be measured during a wavelength scan at high speed (e.g., 1000 nm/s). If the optical component has a sharp slope (e.g., +/−1000 dB/nm), the required dynamic response may be impressive (e.g., +/−1 dB/µs). And this over an optical power dynamic range of about 70 dB.

Very fast high-dynamic optical power acquisitions are also needed for implementing optical spectrum analyzers.

Optical power meters typically employ a photodiode detector which produces an electrical current dependent upon the intensity of light incident thereupon, combined with a transimpedance amplifier (typically comprising a transimpedance operational amplification circuit employing a feedback resistor) to produce a voltage proportional to the photodiode current. Although the dynamic range of photodiodes is very high (power levels ranging from −110 dBm to +10 dBm), that of the transimpedance operational amplification circuit is not as high (typically about 30 dB).

It is known to extend the effective dynamic range of an optical power acquisition circuit by providing a multiscale amplification circuit. For example, as illustrated in FIG. 1A, the amplification circuit may include several feedback resistors in parallel, each with a different resistance value, and a gain selection switch for connecting one of the resistors into the feedback loop. Each resistor corresponds to one gain setting and the dynamic range is thereby extended as much as the number of gain settings. For example, it is possible to obtain a dynamic range of about 90 dB (i.e., $10^9$) using three different gain settings. Of course, variations of such multiscale amplification circuits are possible, such as the one illustrated in FIG. 1B, which provides multiple gain settings using two transimpedance operational amplification lanes, both receiving input signals from the photodiode.

However, a disadvantage of the amplifier shown in FIGS. 1A and 1B as well as other known multiscale photodiode amplifiers is that gain switching may causes glitches and transient effects, introducing distortions at high scanning speed.

Another known possibility is to employ a logarithmic transimpedance amplification circuit. High speed performance and fast acquisitions optical power meters (slope of +/−1000 dB/nm scanned at 1000 nm/s) may be produced with such solution. However, the use of a logarithmic amplifier may lead to frequency-dependent distortions as well as a lack of bandwidth at low power levels, which may undermine measurement linearity and thus accuracy.

There therefore remains a need for a very fast high dynamic optical power acquisition circuit.

SUMMARY

There is proposed an optical power measurement circuit and an optical power meter which use a linear amplification circuit based on multiple transimpedance operational amplification lanes and which add a bootstrap circuit and a compensator circuit. 1) The bootstrap is used to reduce the effect of the photodiode capacitance and increases the amplifier's bandwidth, thereby making distortions less frequency dependent and increasing the allowable scan speed for lower power levels. 2) The compensator circuit monitors the photodiode's voltage and reproduces its transient distortions, to then subtract it from the output and thereby reduce the measurement error.

In accordance with one aspect, there is provided an optical power measurement circuit and an optical power meter comprising:
  a photodiode detector to produce an electrical current dependent upon the intensity of light incident thereupon;
  a first linear transimpedance amplification lane comprising a first transimpedance operational amplifier producing a first output voltage proportional to the electrical current produced by the photodiode detector in accordance with a first gain scale;
  a second linear transimpedance amplification lane comprising a second transimpedance operational amplifier producing a second output voltage proportional to the electrical current produced by the photodiode detector in accordance with a second gain scale which gain value is different from that of the first gain scale;
  a bootstrap circuit connected to suppress the voltage across the photodiode;
  a compensation signal generator circuit configured to monitor the photodiode voltage and produce a first compensation signal reproducing distortions on the photodiode current; and
  a first subtraction circuit connected to the compensation signal generator circuit and the second linear transimpedance amplification lane so as to subtract the first compensation signal from the second output voltage of the second linear transimpedance amplification lane and thereby reduce measurement distortions.

In accordance with another aspect, there is provided a method for measuring optical power comprising:
  using a photodiode detector, producing an electrical current dependent upon the intensity of light incident thereupon;
  using a first linear transimpedance amplification lane comprising a first transimpedance operational amplifier, converting the electrical produced by the photodiode detector into a first output voltage proportional to the electrical current in accordance with a first gain value;
  using a second linear transimpedance amplification lane comprising a second transimpedance operational amplifier, converting the electrical produced by the photodiode detector into a second output voltage proportional to the electrical current in accordance with a second gain value which is different from the first gain value;
  using a bootstrap circuit, suppressing the voltage across the photodiode;

using a compensation signal generator circuit, monitoring the photodiode voltage and producing a first compensation signal proportional to distortions on the photodiode current; and using a first subtraction circuit, subtracting the first compensation signal from the second output voltage of the second linear transimpedance amplification lane to thereby reduce measurement distortions.

In this specification, unless otherwise mentioned, word modifiers such as "substantially" and "about" which modify a value, condition, relationship or characteristic of a feature or features of an embodiment, should be understood to mean that the value, condition, relationship or characteristic is defined to within tolerances that are acceptable for proper operation of this embodiment in the context its intended application.

In the present description, the terms "light" and "optical" are used to refer to radiation in any appropriate region of the electromagnetic spectrum. More particularly, the terms "light" and "optical" are not limited to visible light, but can include, for example, the infrared wavelength range.

Further features and advantages of the present invention will become apparent to those of ordinary skill in the art upon reading of the following description, taken in conjunction with the appended drawings.

BRIEF DESCRIPTION OF THE DRAWINGS

FIGS. 3A, 3B and 3C are graphs showing simulation results for the embodiment of FIG. 2, wherein FIG. 3A represents the optical power at photodiode input, FIG. 3B represents the optical power as measured by the optical power meter of FIG. 2; and FIG. 3C represents the measurement error as obtained from the difference between the traces of FIGS. 3A and 3B.

FIGS. 6A, 6B and 6C are graphs showing simulation results for the embodiment of FIG. 5, wherein FIG. 6A represents the optical power at photodiode input; FIG. 6B represents the optical power measurement signal as measured by the optical power meter of FIG. 5; and FIG. 6C represents the measurement error as obtained from the difference between traces of FIGS. 6A and 6B.

FIGS. 9A, 9B and 9C are graphs showing simulation results for the embodiment of FIG. 8 on saturation and desaturation of voltage output V1, wherein FIG. 9A represents the compensation signal V2$c$, the output voltage V2 and the corrected output voltage $-V2'=V2-V2c$ (sign is inverted so to match the sign of the output voltage V2 on the graph); FIG. 9B represents the optical power at photodiode input; and FIG. 9C represents the difference in voltage between the cathode and the anode of the photodiode during saturation and desaturation of voltage output V1.

FIGS. 10A, 10B and 10C are graphs showing simulation results for the embodiment of FIG. 8 on saturation and desaturation of voltage output V2, wherein FIG. 10A represents the output voltage V3 and the corrected output voltage $-V3'=V3-V(anode)$ (sign is inverted so to match the sign of the output voltage V3 on the graph); FIG. 10B represents the optical power at photodiode input; and FIG. 10C represents the voltage on cathode and anode of the photodiode during saturation and desaturation of voltage output V2.

FIGS. 11A, 11B and 11C are graphs showing simulation results for the embodiment of FIG. 8, considering a scan speed of 500 nm/s on an optical component showing a slope of +/−1000 dB/nm, wherein FIG. 11A represents the optical power at photodiode input; FIG. 11B represents the optical power as measured by the optical power meter of FIG. 8; and FIG. 11C represents the measurement error as obtained from the difference between the traces of FIGS. 11A and 11B.

FIGS. 12A, 12B and 12C are graphs showing simulation results for the embodiment of FIG. 8, considering a scan speed of 1000 nm/s on an optical component showing a slope of +/−1000 dB/nm, wherein FIG. 12A represents the optical power at photodiode input; FIG. 12B represents the optical power as measured by the optical power meter of FIG. 8; and FIG. 12C represents the measurement error as obtained from the difference between the traces of FIGS. 12A and 12B.

Figure 1B:
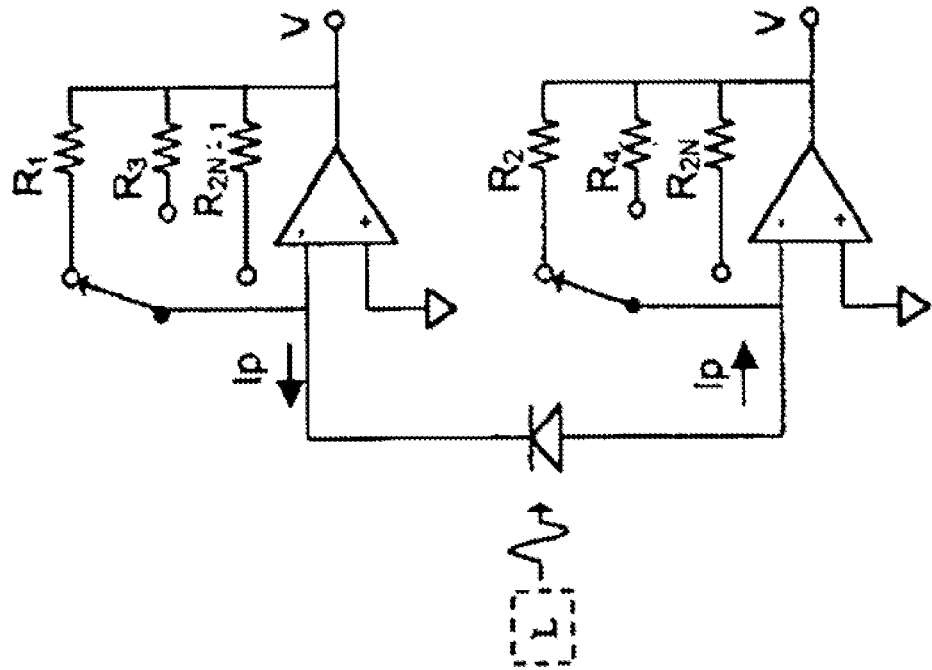
FIG. 1B (PRIOR ART) is a schematic illustrating a multiscale amplification circuit comprising two transimpedance amplification lanes with switched feedback resistors.
Figure 1A:
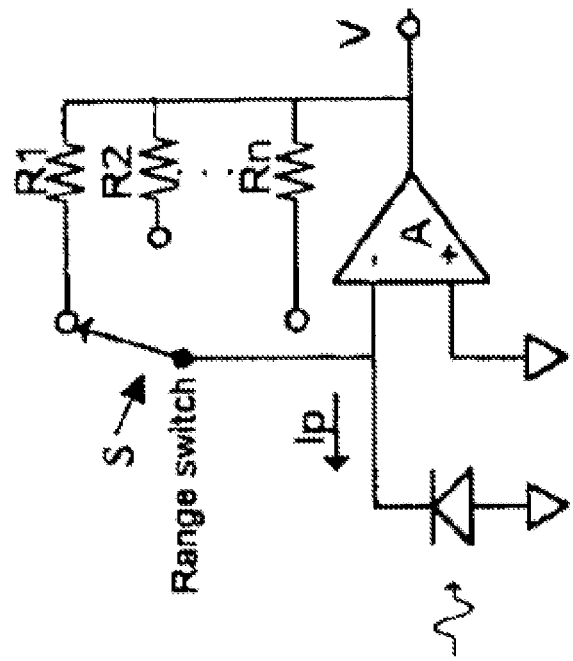
FIG. 1A (PRIOR ART) is a schematic illustrating a multiscale amplification circuit comprising a single transimpedance amplification lane with switched feedback resistors.

It will be noted that throughout the drawings, like features are identified by like reference numerals. In the following description, similar features in the drawings have been given similar reference numerals and, to not unduly encumber the figures, some elements may not be indicated on some figures if they were already identified in a preceding figure. It should be understood herein that elements of the drawings are not necessarily depicted to scale, since emphasis is placed upon clearly illustrating the elements and structures of the present embodiments. Some mechanical or other physical components may also be omitted in order to not encumber the figures.

The following description is provided to gain a comprehensive understanding of the methods, apparatus and/or systems described herein. Various changes, modifications, and equivalents of the methods, apparatuses and/or systems described herein will suggest themselves to those of ordinary skill in the art. Description of well-known functions and structures may be omitted to enhance clarity and conciseness.

Although some features may be described with respect to individual exemplary embodiments, aspects need not be limited thereto such that features from one or more exemplary embodiments may be combinable with other features from one or more exemplary embodiments.

DETAILED DESCRIPTION

Figure 2:
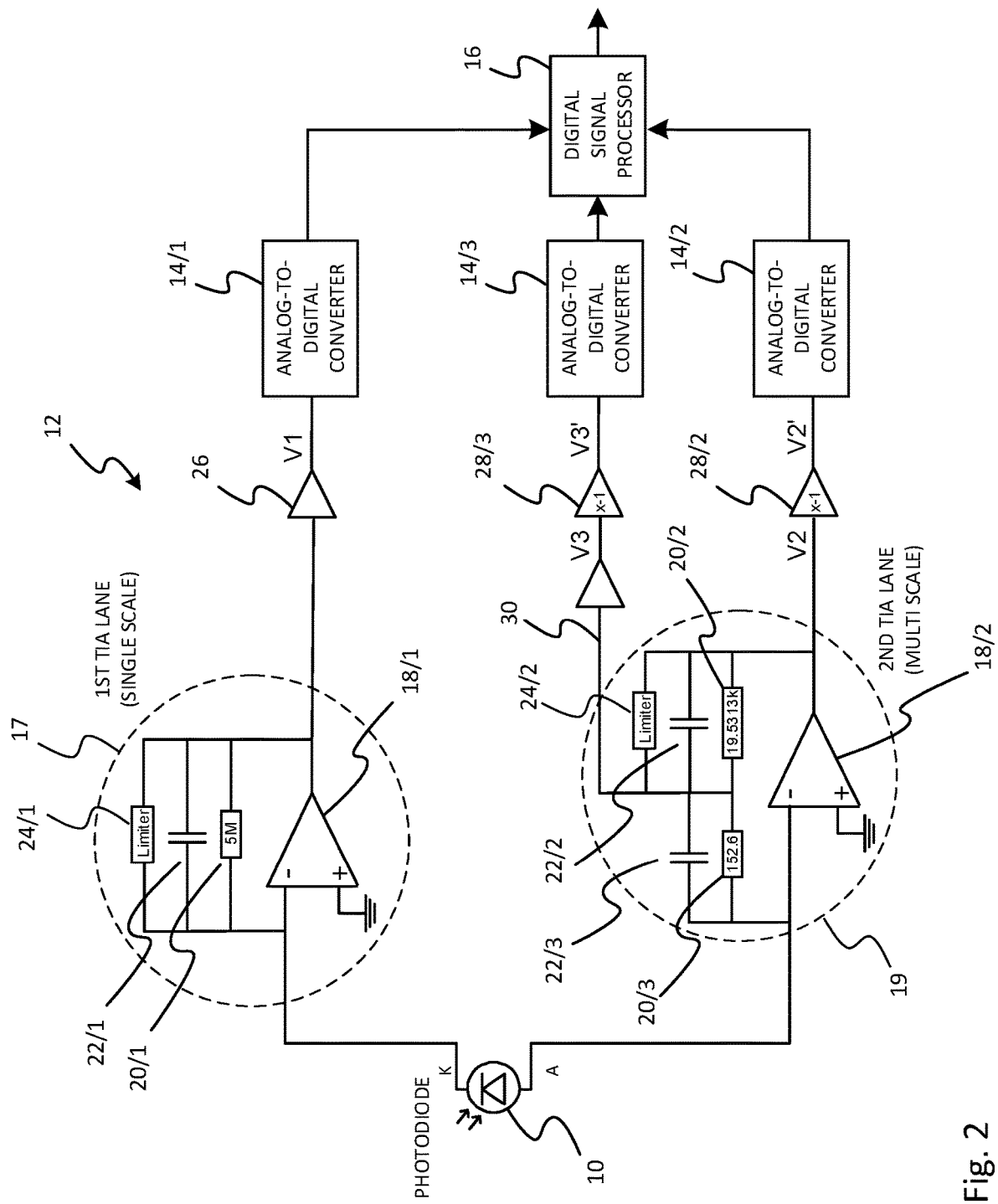
FIG. 2 is a schematic illustrating an optical power meter comprising a multiscale amplification circuit in accordance with one embodiment having one single-scale transimpedance amplification lane and one dual-scale transimpedance amplification lane.

Now referring to the drawings, FIG. 2 shows an optical power meter comprising a photodiode detector 10 and a multiscale amplification circuit 12, analog-to-digital converters 14 and a digital signal processor 16.

The photodiode detector 10 produces an electrical current dependent upon the intensity of light incident thereupon and the power of which to be measured (with a photodiode responsivity such as, e.g., 1 A/W). The amplification circuit 12 is a multiscale transimpedance amplifier used to produce output voltage proportional to the photodiode electrical current.

The multiscale amplification circuit 12 of FIG. 2 comprises a single-scale linear transimpedance amplification (TIA) lane 17 and a dual-scale linear transimpedance amplification (TIA) lane 19 respectively connected to the cathode and the anode of the photodiode detector 10.

The linear transimpedance amplifier of the first TIA lane 17 comprises an operational amplifier 18/1 with a feedback circuit comprising at least a feedback resistor 20/1 connected between the output of the operational amplifier 18/1 and its inverting input port, so that the output voltage V1 of the transimpedance amplifier is proportional to the photodiode electrical current which is applied to the inverting input port of the operational amplifier 18/1. An optional capacitor 22/1 may be added in parallel with the feedback resistor 22/1 to improve the stability of the first TIA lane 17, as well as optimizing the maximum bandwidth and flatness of the response. As known in the art, a feedback limiter circuit 24/1 is further added to avoid the overrange problems. A simple feedback limiter circuit may consist of a diode in parallel with the feedback resistor, but more complex limiter circuits are also possible, as known in the art.

The first amplifier gain value is determined by the value of the feedback resistor 20/1. The largest value measurable by the transimpedance amplifier is determined by the amplifier saturation characteristics, whereas the smallest measurable value is determined by the linear transimpedance amplifier noise (including photodiode, operational amplifier and the resistor noise). The dynamic range of such photodiode amplifier configuration is typically about 25 to 30 dB.

The output voltage V1 of the transimpedance amplifier is fed to an analog-to-digital converters 14/1 (here through a buffer 26) to convert the analog output voltage into a digital signal representative of the value of the output voltage V1.

It is known to extend the effective dynamic range of an amplification circuit by providing a multiscale amplification circuit 12. For that purpose, in the circuit of FIG. 2, a second linear transimpedance amplifier (second TIA lane 19) is provided. In some embodiments, the second TIA lane 19 may be made single scale as that of the first TIA lane 17. However, in the embodiment of FIG. 2, the second TIA lane 19 is made multiscale in order for the amplification circuit 12 to provide a total of three gain scales. The second TIA lane 19 therefore comprises a second and a third gain scale (producing gain values different from that of the first gain scale of the first TIA lane 17) to respectively produce output voltage V2 and output voltage V3, each proportional (with mutually different constants of proportionality) to the electrical current produced by the photodiode detector.

In order to produce multiple scales, the linear transimpedance amplifier of the second TIA lane 19 comprises an operational amplifier 18/2 with a feedback circuit comprising at least two feedback resistors 20/2, 20/3 connected in series between the output of the operational amplifier 18/2 and its inverting input port. The output voltage V2 of the transimpedance amplifier is proportional to the photodiode electrical current which is applied to the inverting input port of the operational amplifier 18/2. It is noted that the sign of the electrical current at the input of the second TIA lane 19 is opposite to that at the input of the first TIA lane 17. To account for that sign difference, an inverter 28/2 may be connected to the output of the of the operational amplifier 18/2 to change the sign of the output voltage and produce output voltage V2'. Of course, in other embodiments, the sign of the output voltage could also be inverted numerically.

The third scale is obtained via an additional output port 30 taken on a point between the two feedback resistors 20/2, 20/3. The output voltage V3 at the output port 30 is proportional to the photodiode electrical current which is applied to the inverting input port of the operational amplifier 18/2. Again, the sign of the electrical current at the input of the second TIA lane 19 is opposite to that at the input of the first TIA lane 17 and an inverter 28/3 may be connected at the output port 30 to change the sign and produce output voltage V3'.

As in the first TIA lane 17, optional bypass capacitors 22/2, 22/3 may be added in parallel with the feedback resistors 20/2, 20/3 to improve circuit stability. A feedback limiter circuit 24/2 may further be added in parallel with the feedback resistor 20/1 to avoid the overrange problems.

The second amplifier gain value is determined by the sum value of the feedback resistors 20/2, 20/3, whereas the third amplifier gain value is determined by the value of the feedback resistor 20/3.

The output voltages V2' and V3' of the transimpedance amplifier of the second TIA lane 19 are fed to analog-to-digital converters 14/2, 14/3 to convert the analog output voltages into digital signals representative of the values of the output voltages V2', V3'.

It will be understood that depending on the application, in other embodiments, the TIA lane 19 could easily be made single scale (similar to TIA lane 17) instead of multiscale. Of course, the number of TIA lanes may also vary.

Digital signals corresponding to output voltages V1, V2' and V3' are processed by the digital signal processor 16 to produce a digital optical power measurement signal proportional to the electrical current of the photodiode detector. More specifically, the digital signal processor 16 may convert the output voltage values (V1, V2', V3') into an optical power measurement value knowing the gain values of the TIA lanes 17, 19 and the photodiode responsivity (e.g., obtained from a prior calibration). The digital signal processor 16 also combines the digital signals in a way to automatically select the right gain scale (V1, V2' or V3') to use.

In one specific embodiment wherein the photodiode equivalent capacitance is 140 pF and based on the operational amplifier used, optimal design values of the feedback resistors and capacitors of the circuit of FIG. 2 were calculated and are shown in the following table, which also shows the resulting bandwidth for each gain scale output:

|  | Rf | Cf | Flatness 1% Band | 3 dB Bandwidth |
|---|---|---|---|---|
| Scale 1 | 5 MΩ | 0.5 pF | 19.4 kHz | 90 kHz |
| Scale 2 | 19.5313 kΩ | 8.9 pF | 210 kHz | 1.28 MHZ |
| Scale 3 | 152.6 Ω | 130 pF | 6.1 MHz | 16.2 MHz |

Of course, it will be understood that these values may be varied by design depending on the specific intended application.

The configuration of FIG. 2 combines two TIA lanes, both receiving an input signal from the photodiode. As shown herein below, this configuration provides simultaneous scales but switching between TIA lanes introduces transient distortions caused by the transient saturation/desaturation of the current limiter components.

FIGS. 3A, 3B, 3C, 4A, 4B, 4C and 4D show simulation results for the embodiment of FIG. 2, considering a scan speed of 500 nm/s on an optical component showing a slope of +/−1000 dB/nm.

Figure 3A:
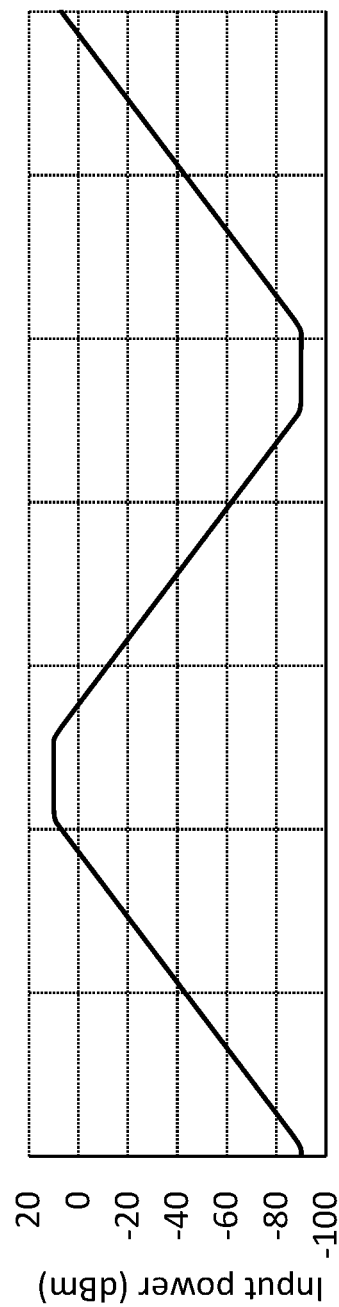
Figure 3B:
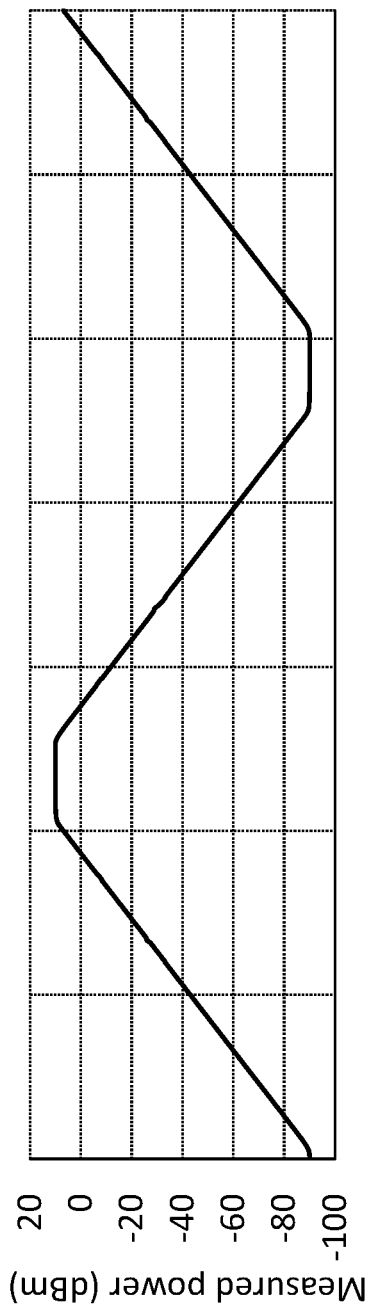

FIG. 3A represents the optical power at photodiode input and FIG. 3B represents the optical power as measured by the optical power meter of FIG. 2. It should be noted that a delay was added to the optical power trace in order for the two traces to match on the abscissa axis.

Figure 3C:
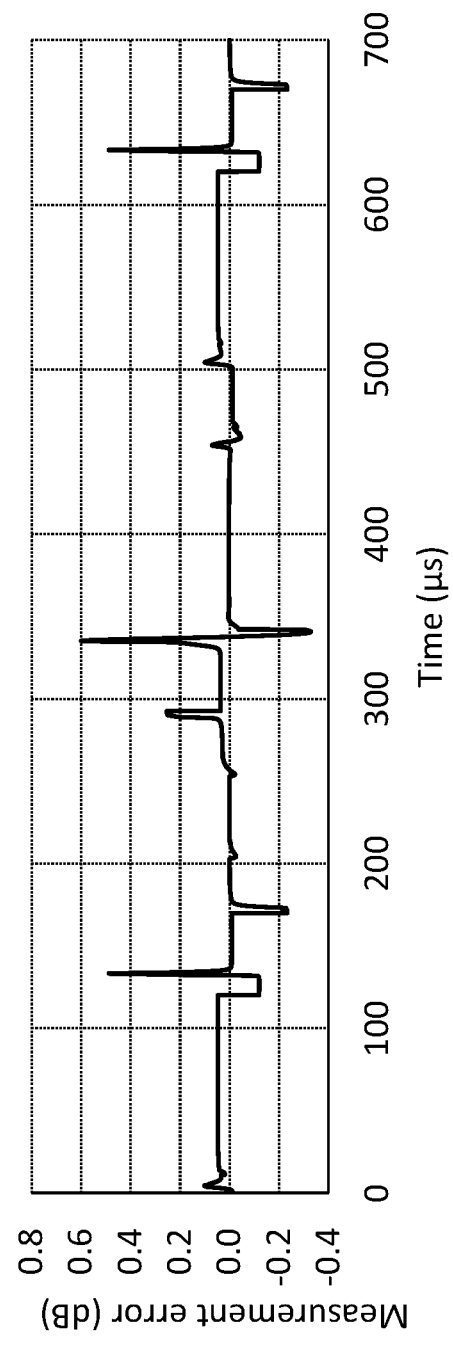

FIG. 3C represents the measurement error as obtained from the difference between the traces of FIGS. 3A and 3B.

Figure 4A:
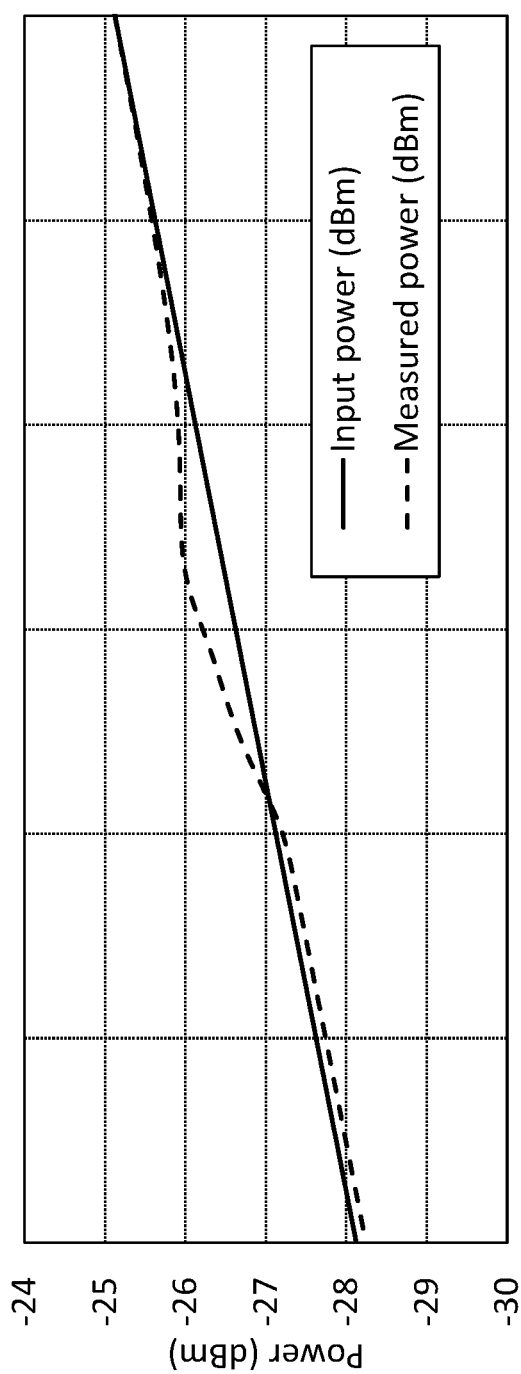
FIGS. 4A and 4B are close-up views of the graphs of FIGS. 3A, 3B, 3C, around 133 μs.
Figure 4B:
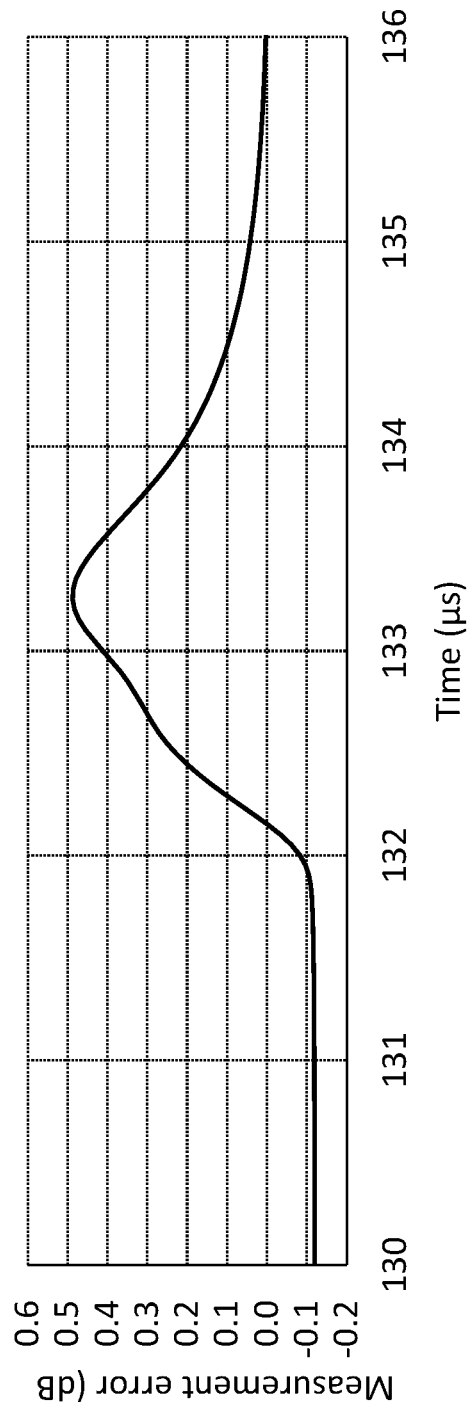
Figure 4C:
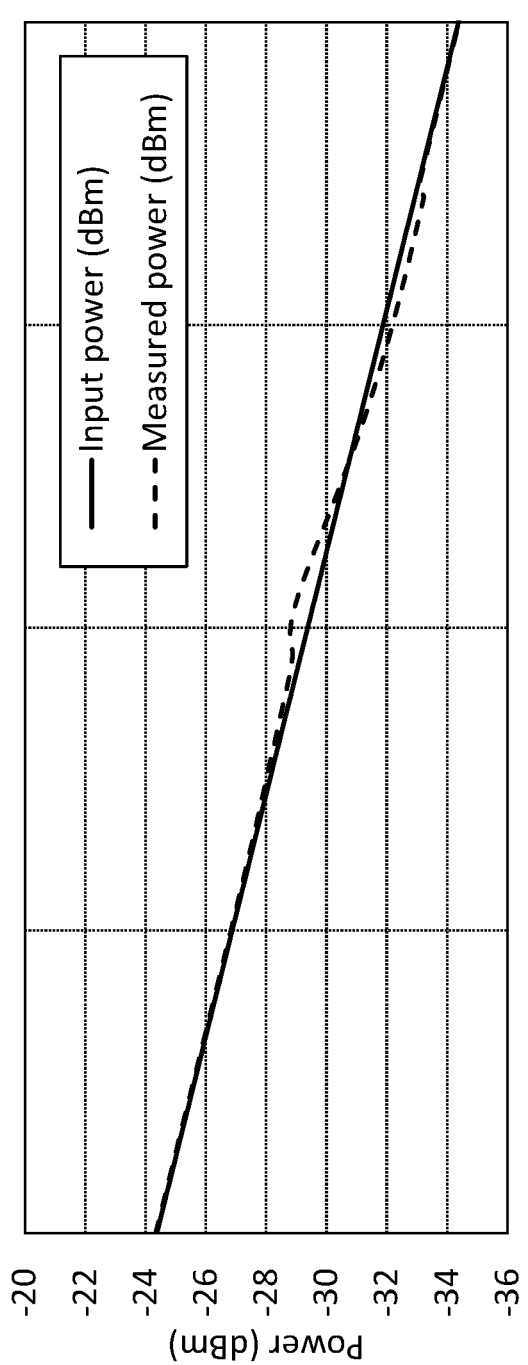
FIGS. 4C and 4D are close-up views of the graphs of FIGS. 3A, 3B, 3C, around 335 μs.
Figure 4D:
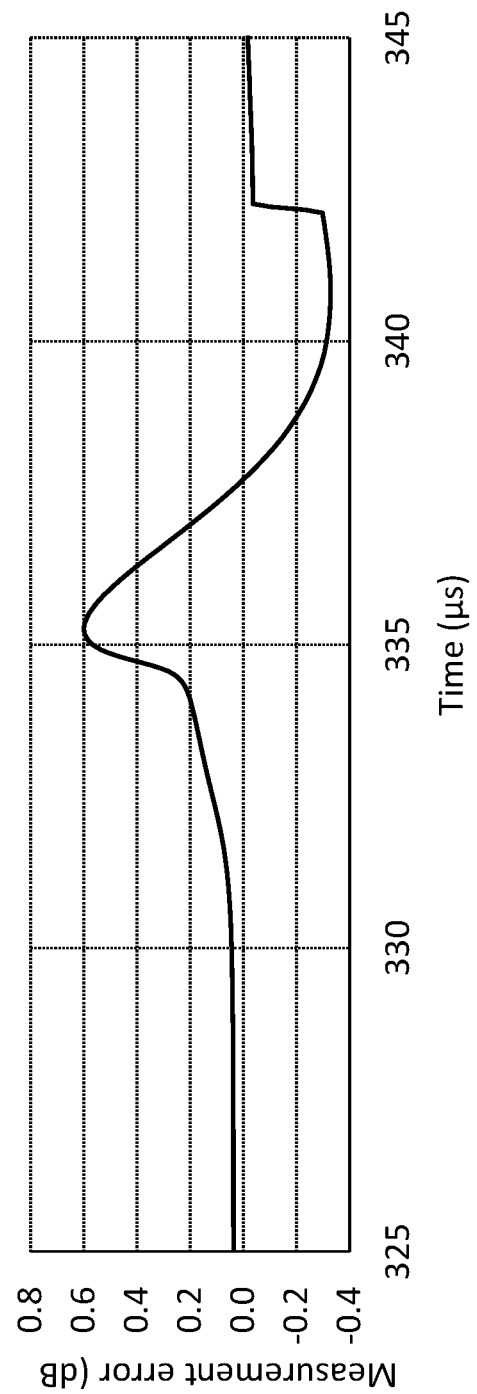

FIGS. 4A and 4B are close-up views of the graphs of FIGS. 3A, 3B and 3C, around 133 µs. FIGS. 4C and 4D are close-up views of the graphs of FIGS. 3A, 3B, 3C, around 335 µs. These views show that measurement errors (between about −0.3 dB to +0.6 dB) arise mainly in optical power slopes. These errors correspond to the saturation and desaturation of the diodes in the feedback limiter circuits 24/1, 24/2.

When the feedback diodes switch from a conducting state to a non-conducting state, or inversely, a voltage arises on the inverting input port of the first and second transimpedance operational amplifiers (connected respectively to the transimpedance operational amplifier and anode of the photodiode detector 10). This voltage generates in an error current $I_{err}$ in the photodiode equivalent capacitance:

$$I_{err} = C0 * dV/dt$$

wherein C0 is the photodiode equivalent capacitance C0 and the dV/dt is the scan speed.

This error current adds to the photocurrent measured by the transimpedance operational amplifiers, which result in a measurement error, the amplitude of which depends on the photodiode equivalent capacitance C0 and the measurement slope dV/dt.

Of course, the equivalent capacitance of the photodiode is intrinsic to its construction (depends on its active surface, the presence of a cooler, the internal layout, etc.) and cannot be eliminated. As to the measurement slope dV/dt, it is aimed to maximize this key factor in order to meet customer requirements.

Figure 5:
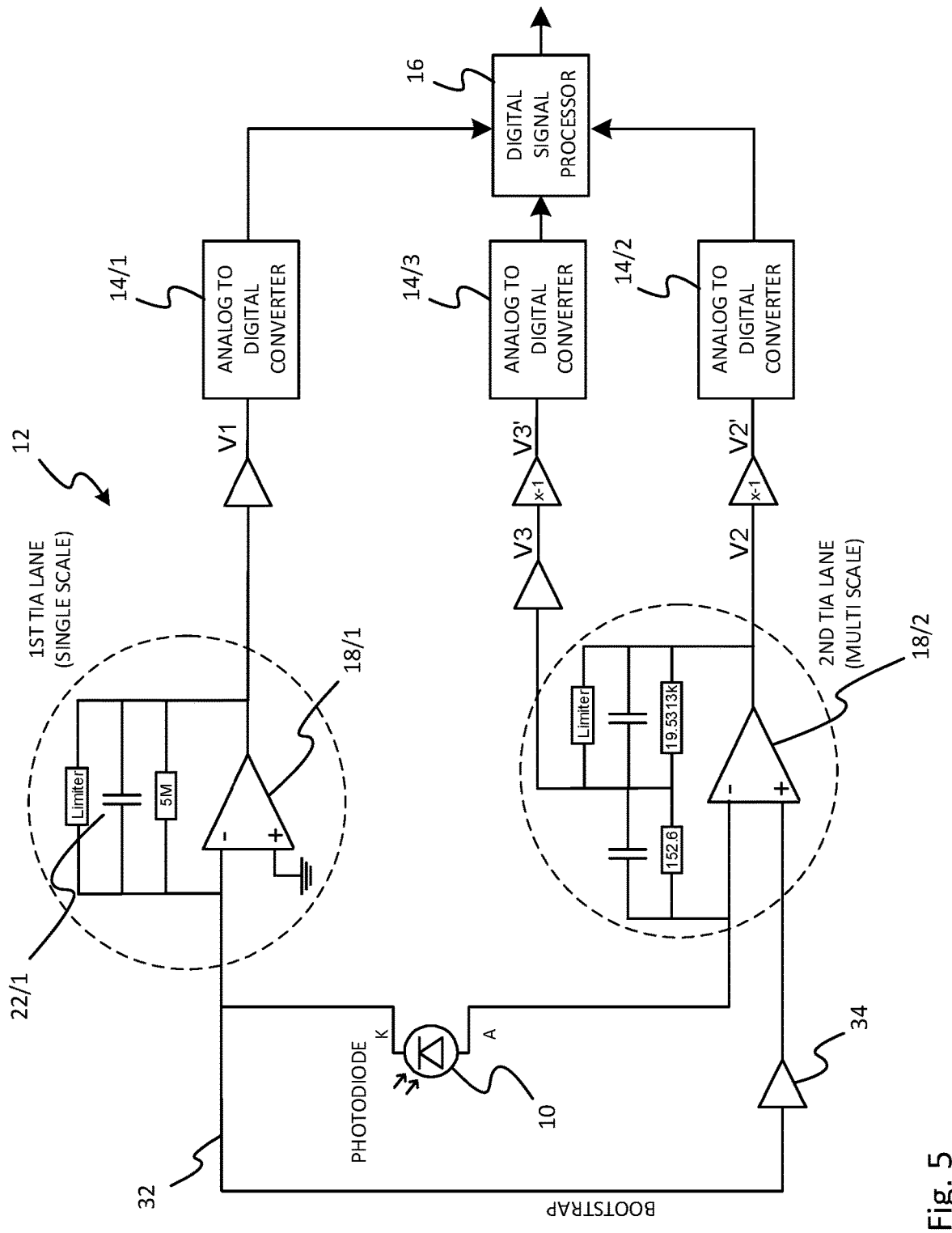
FIG. 5 is a schematic illustrating an optical power meter comprising a multiscale amplification circuit in accordance with one embodiment having one single-scale transimpedance amplification lane, one dual-scale transimpedance amplification lane, with an added bootstrap.

FIG. 5 shows the optical power meter of FIG. 2 in which a bootstrap circuit 32 is added. Except for the added bootstrap circuit 32, the configuration of the multiscale amplification circuit 12 of the embodiment of FIG. 5 is the same as that of the embodiment of FIG. 2 and equivalent features will therefore not be repeatedly described. Similarly, the embodiment of FIG. 5 also includes analog-to-digital converters 14/1, 14/2, 14/3 as well as a digital signal processor 16.

The bootstrap circuit 32 is connected in a manner to suppress the voltage across the photodiode. In the embodiment of FIG. 5, the bootstrap circuit 32 comprises a buffer 34 connected to feed any voltage on the photodiode cathode to the noninverting input port of the transimpedance operational amplifier 18/2, which inverting input port is connected to the photodiode anode. The bootstrap circuit 32 is used to reduce the effect of the photodiode capacitance, increase the amplifier's bandwidth and make distortions less frequency dependent.

It is noted that the value of the feedback capacitor 22/1 may need to be modified for better optimization of the design.

In one specific embodiment wherein the photodiode equivalent capacitance is 140 pF and based on the operational amplifier used, optimal design values of the feedback resistors and capacitors of the circuit of FIG. 5 were calculated and are shown in the following table, which also shows the resulting bandwidth for each gain scale output:

|  | Rf | Cf | Flatness 1% Band | 3 dB Bandwidth |
|---|---|---|---|---|
| Scale 1 | 5 MΩ | 0.2 pF | 88.5 kHz | 238 kHz |
| Scale 2 | 19.5313 kΩ | 8.9 pF | 198 kHz | 1.3 MHz |
| Scale 3 | 152.6 Ω | 130 pF | 3.1 MHz | 16.2 MHz |

As shown in the table, the added bootstrap results in an increased bandwidth from 90 kHz to 238 kHz for the first gain scale.

FIGS. 6A, 6B, 6C, 7A, 7B, 7C and 7D show simulation results for the embodiment of FIG. 5, considering a scan speed of 500 nm/s on an optical component showing a slope of +/−1000 dB/nm.

Figure 6A:
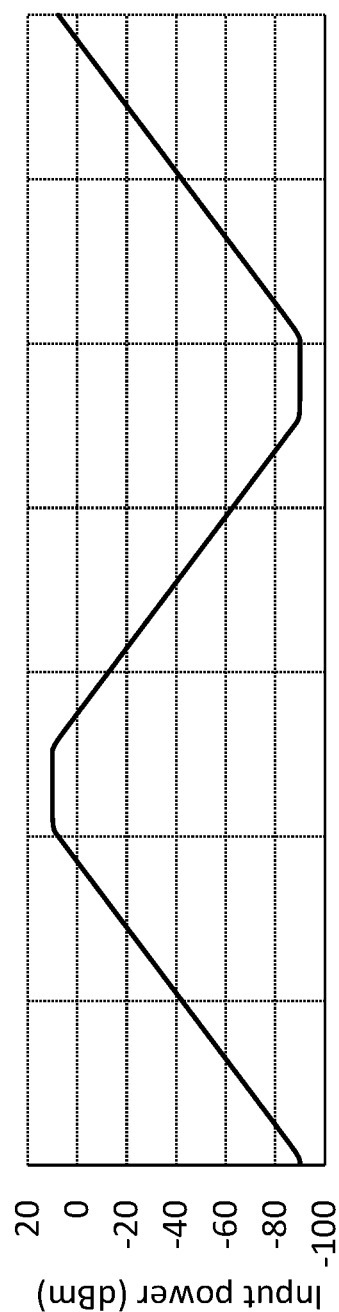
Figure 6B:
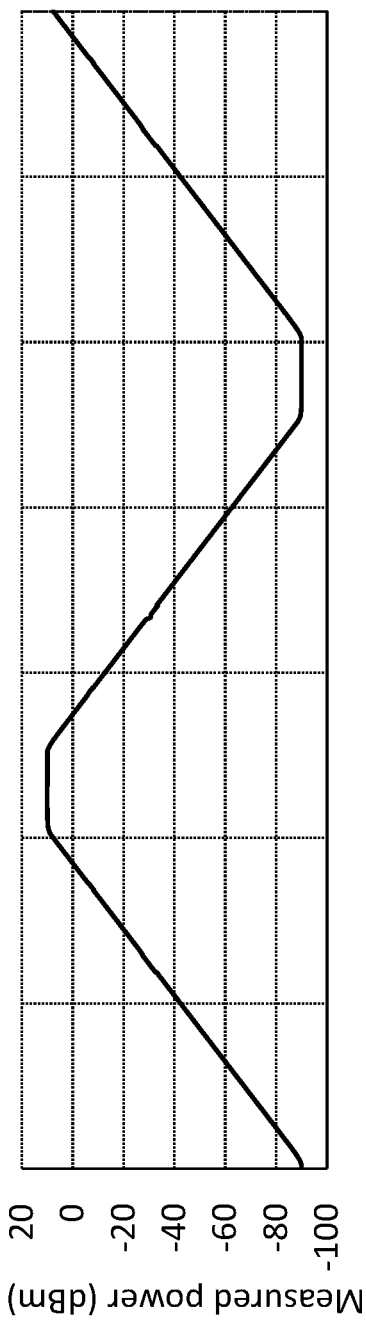

Again, FIG. 6A represents the optical power at photodiode input and FIG. 6B represents the optical power as measured by the optical power meter of FIG. 5. It should be noted that a delay was added to the optical power trace in order for the two traces to match on the abscissa axis.

Figure 6C:
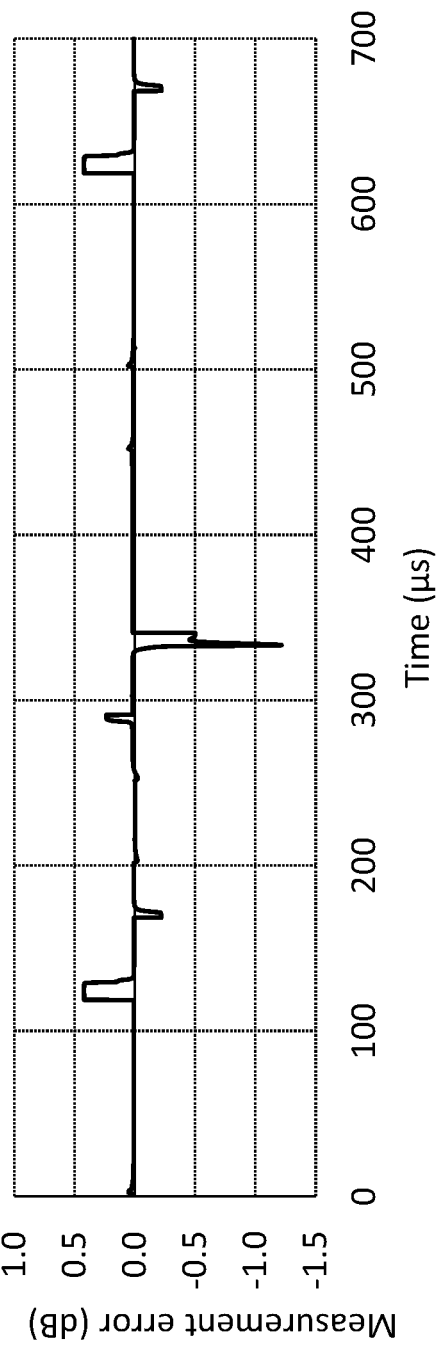

FIG. 6C represents the measurement error as obtained from the difference between the traces of FIGS. 6A and 6B.

Figure 7A:
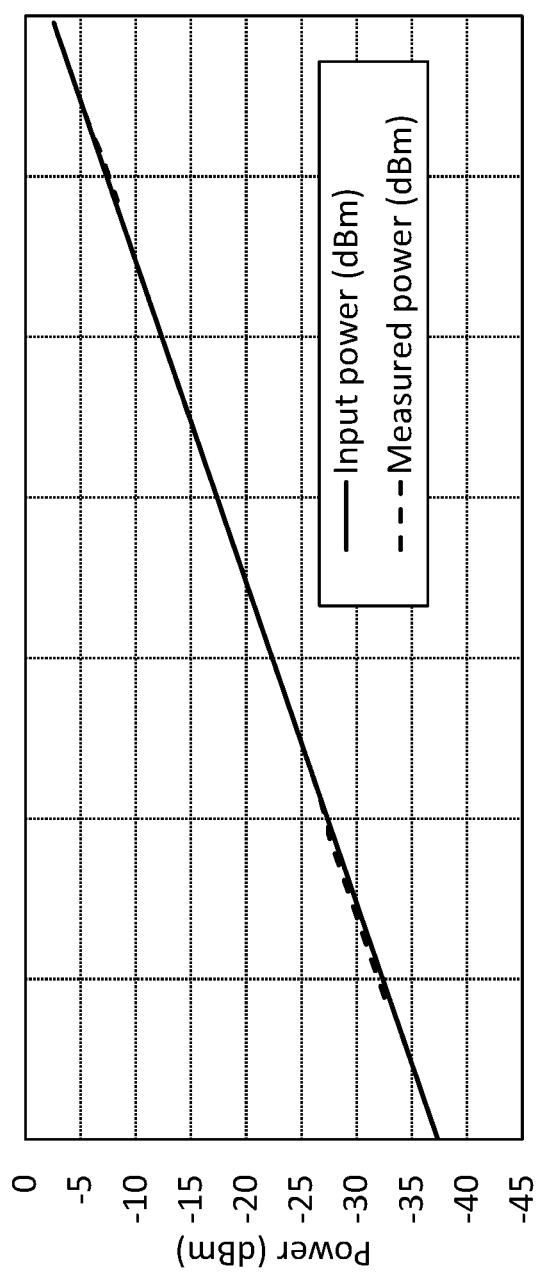
FIGS. 7A and 7B are close-up views of the graphs of FIGS. 6A, 6B, 6C around 145 μs.
Figure 7B:
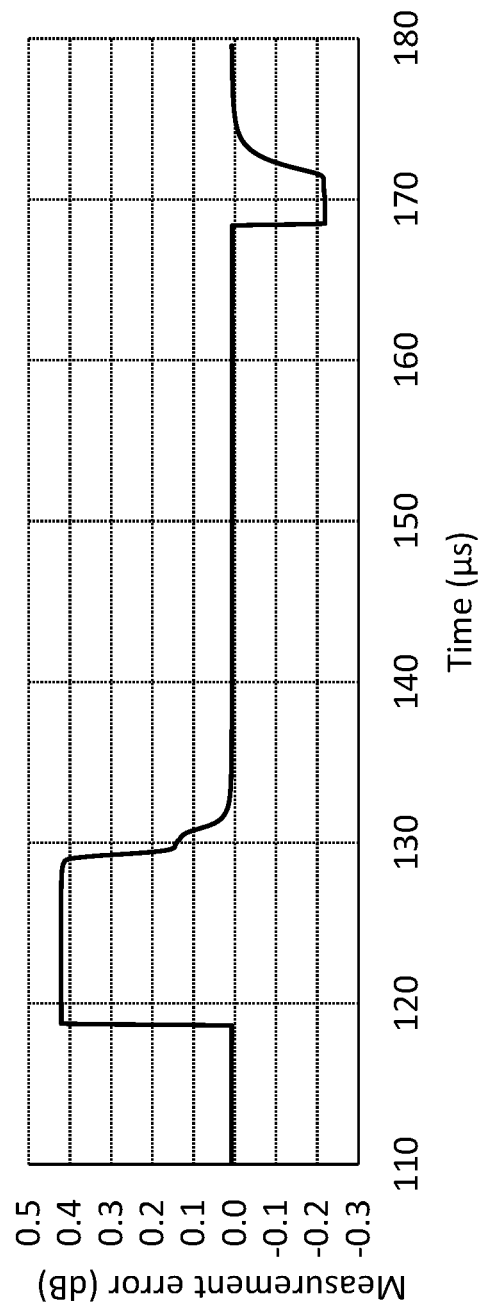
Figure 7C:
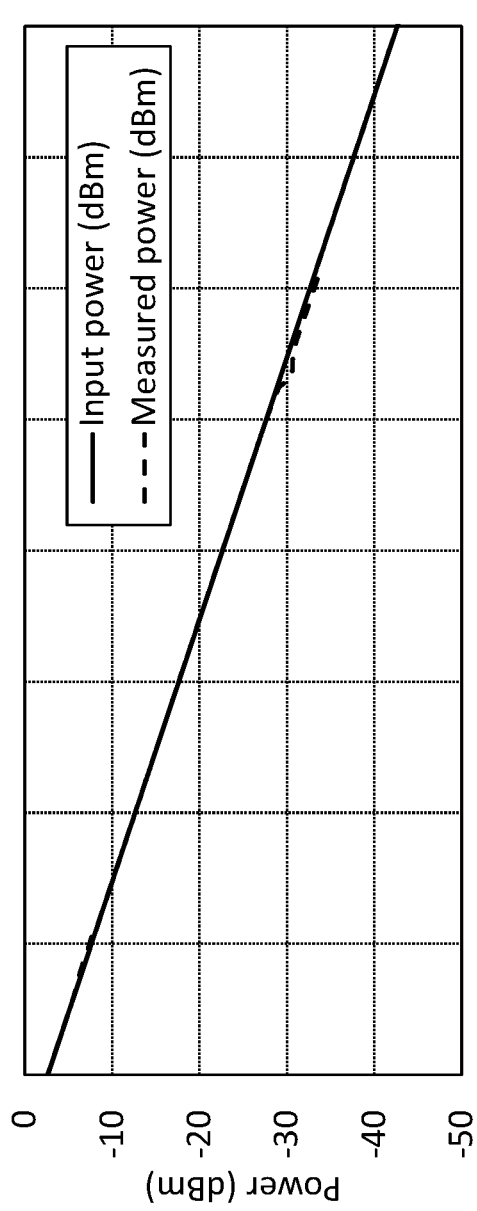
FIGS. 7C and 7D are close-up views of the graphs of FIGS. 6A, 6B, 6C around 320 μs.
Figure 7D:
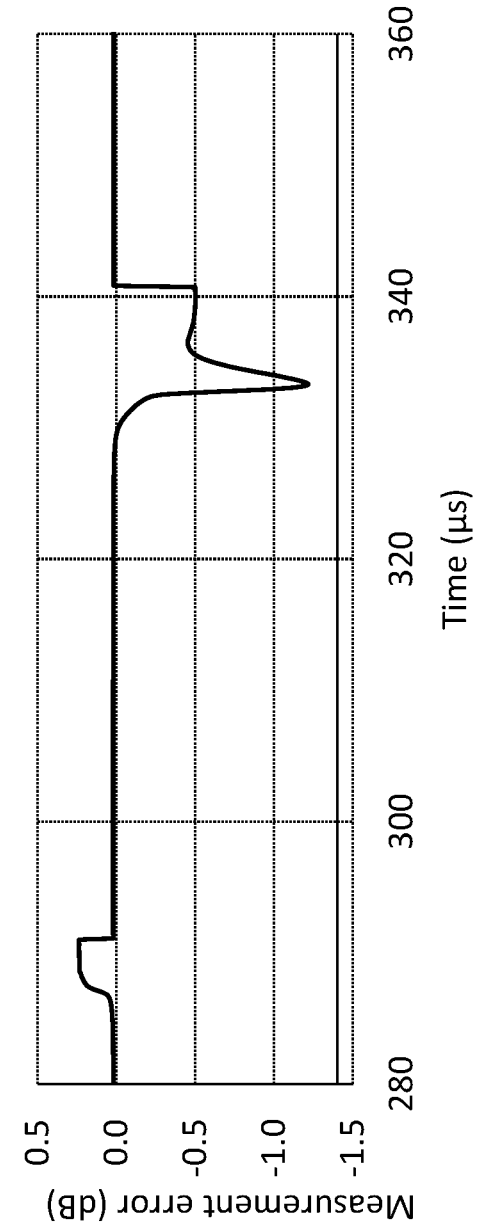

FIGS. 7A and 7B are close-up views of the graphs of FIGS. 6A, 6B and 6C around 145 µs. FIGS. 7C and 7D are close-up views of the graphs of FIGS. 6A, 6B and 6C around 320 µs. These views show that measurement errors still arise mainly in optical power slopes and that no significant improvement is obtained or the measurement error compared to the configuration of FIG. 2.

Figure 8:
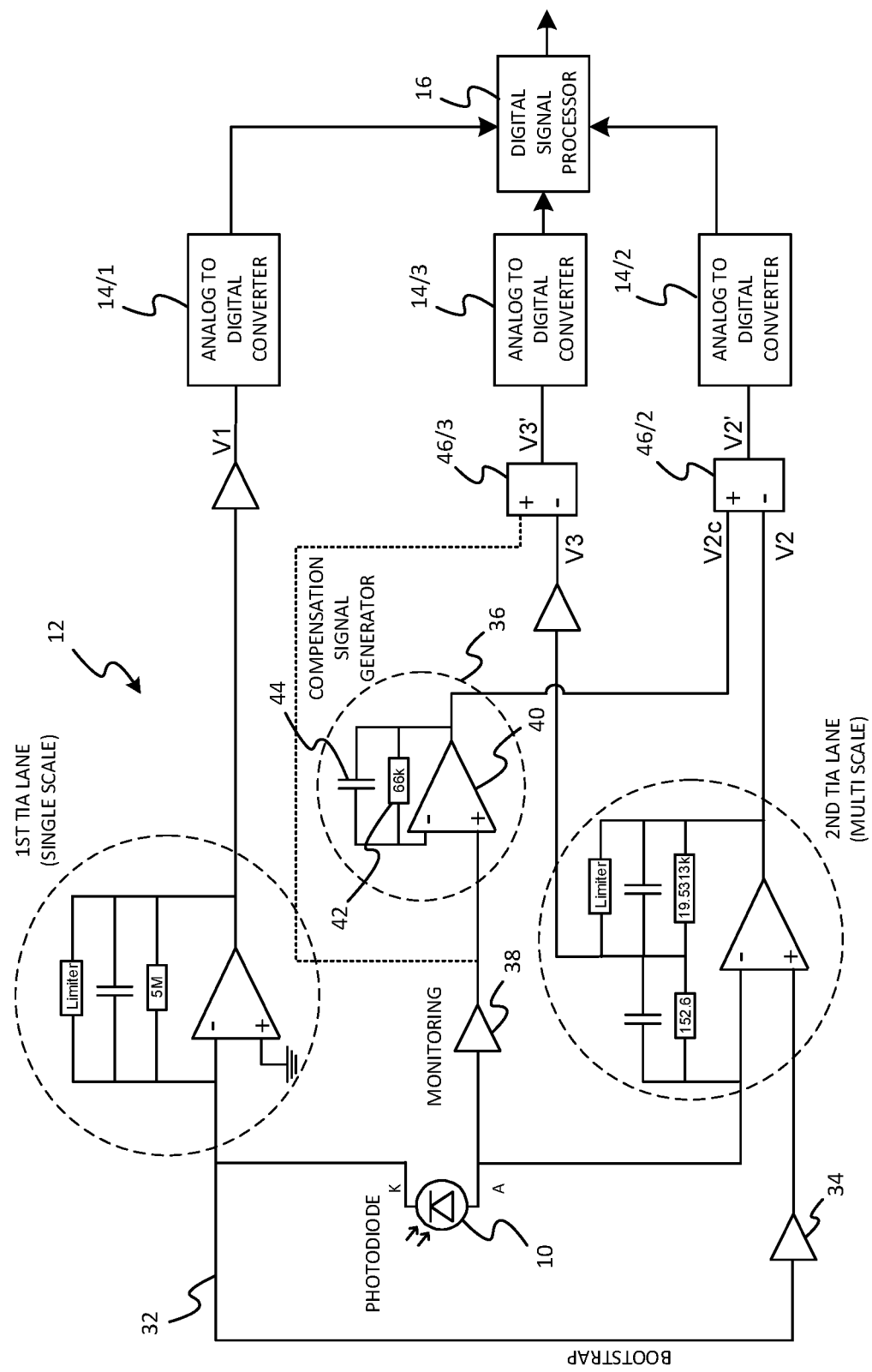
FIG. 8 is a schematic illustrating an optical power meter comprising a multiscale amplification circuit in accordance with one embodiment having one single-scale transimpedance amplification lane, one dual-scale transimpedance amplification lane, a bootstrap and a compensation signal generator.

Now, FIG. 8 shows the optical power meter of FIG. 5 in which a compensation signal generator circuit 36 is added. Except for the added compensation signal generator circuit 36, the configuration of the multiscale amplification circuit 12 of the embodiment of FIG. 8 is the same as that of the embodiment of FIG. 5 and equivalent features will therefore not be repeatedly described. Similarly, the embodiment of FIG. 8 also includes analog-to-digital converters 14/1, 14/2, 14/3 as well as a digital signal processor 16.

Figure 9A:
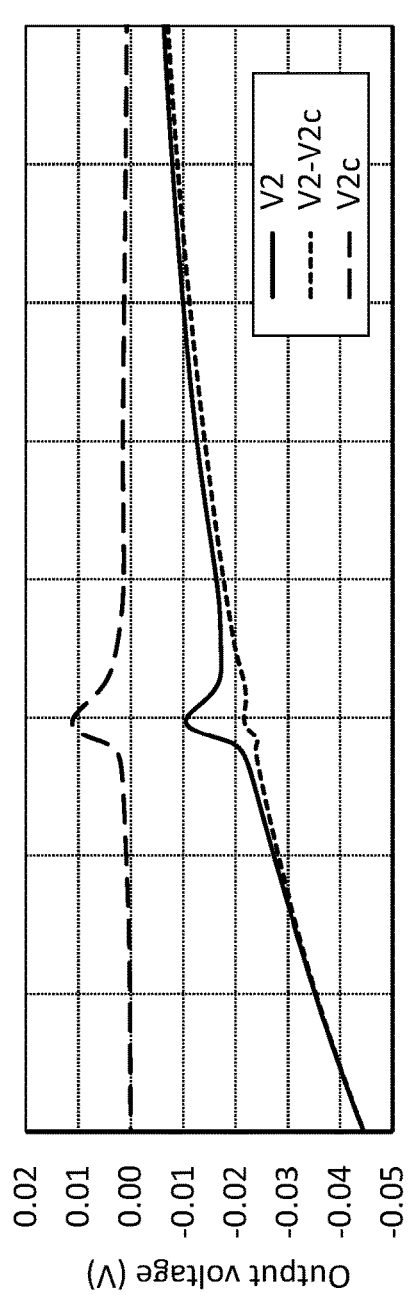
Figure 9B:
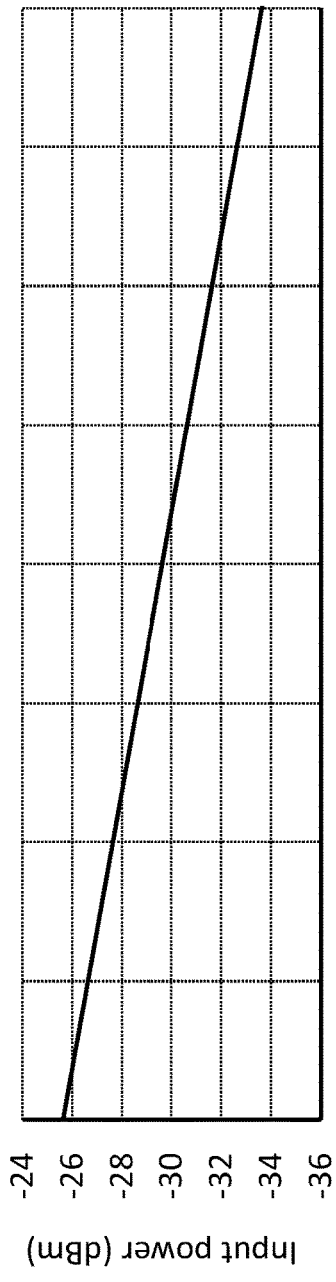
Figure 9C:
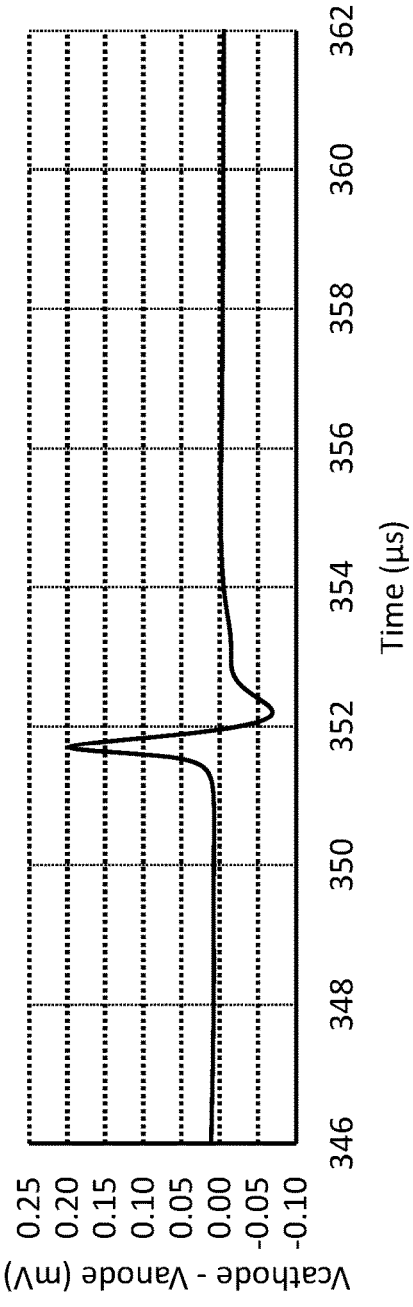

Referring to FIGS. 9A, 9B and 9C, it was found that at saturation and desaturation of voltage output V1 (limiter 24/1), the active gain scale is that of voltage output V2. The voltage on cathode and anode of the photodiode 10 are then altered by the saturation and desaturation (see FIG. 9C). By monitoring the voltage on the anode (or cathode), a compensation signal V2c at least partly equivalent to the error added on output voltage V2 can be produced (see FIG. 9A)

and subtracted from V2 to reduce the error and yield a corrected output voltage V2' (see FIG. 9A).

FIG. 9A represents the compensation signal V2c, the output voltage V2 and the corrected output voltage −V2'=V2−V2c (sign is inverted so to match the sign of the output voltage V2 on the graph). FIG. 9B represents the optical power at photodiode input. Again, a delay was added to the optical power trace in order for the traces to match on the abscissa axis. FIG. 9C represents difference in the voltage between the cathode and the anode of the photodiode 10 during saturation and desaturation of voltage output V1.

Therefore, in the embodiment of FIG. 8, compensation is accomplished using the compensation signal generator circuit 36 which monitors the photodiode voltage (here on the anode thereof) to produce a compensation signal V2c.

More specifically, the anode signal is monitored using a buffer 38 which output is fed to the compensation signal generator circuit 36. The compensation signal generator circuit 36 comprises an operational amplifier 40 which is of the same model as the operational amplifiers 18/1 and 18/2, and which is connected in a negative-feedback like configuration, wherein a feedback circuit comprising a feedback resistor 42 and feedback capacitor 44 is connected between the output of the operational amplifier 40 and its inverting input port and the monitored signal is received on the noninverting input port. The output voltage V2c thereby produces a compensation signal that is proportional to the photodiode anode voltage. By selecting the right resistance value of the feedback resistor 42, the generated compensation signal at least partly reproduces the measurement error present on the output voltage V2. An optional bypass capacitor 44 may also be added in parallel with the feedback resistor 42 to improve circuit stability.

The compensation signal V2c is then subtracted from the output voltage V2 using a subtraction circuit 46/2 to reduce measurement distortions and produce a corrected output voltage V2'.

It is noted that although in the embodiment of FIG. 8, the compensation signal is generated from the voltage monitored on the anode of the photodiode detector 10, the voltage on the cathode could be used as well.

Figure 10A:
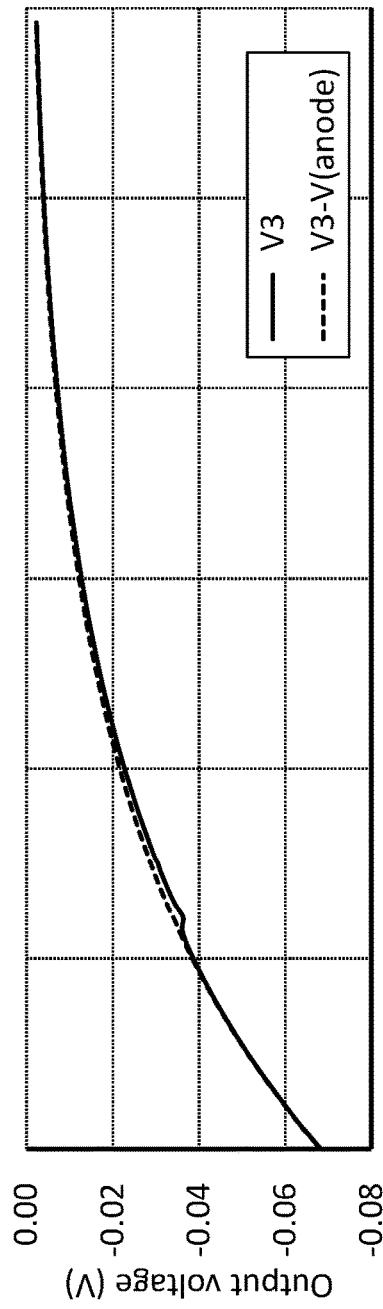
Figure 10B:
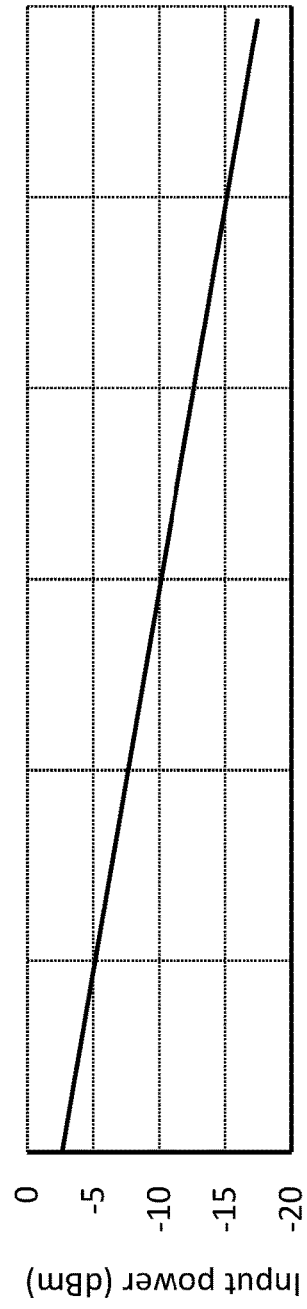
Figure 10C:
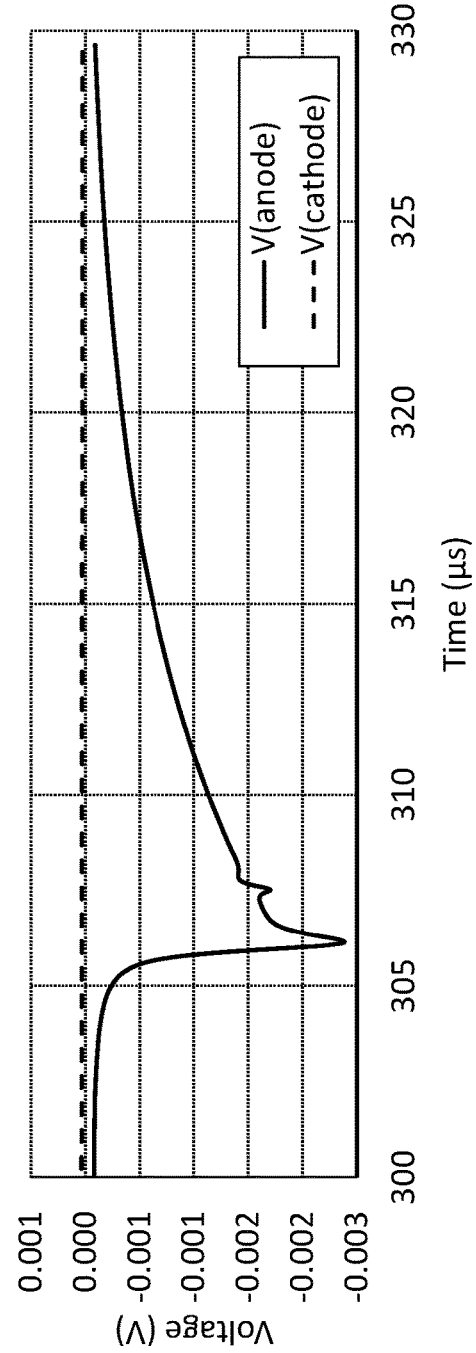

Similarly, now referring to FIGS. 10A, 10B and 10C, it was found that at saturation and desaturation of voltage output V2 (limiter 24/2), the active gain scale is that of voltage output V3. The voltage on the anode of the photodiode 10 is then altered by the saturation and desaturation (see FIG. 10C) and the error on voltage output V3 directly corresponds to the voltage on the anode, which can be subtracted from V3 to reduce the error and yield a corrected output voltage V3' (see FIG. 10A).

FIG. 10A represents the output voltage V3 and the corrected output voltage −V3'=V3−V(anode) (sign is inverted so to match the sign of the output voltage V3 on the graph). FIG. 10B represents the optical power at photodiode input. Again, a delay was added to the optical power trace in order for the traces to match on the abscissa axis. FIG. 10C represents the voltage on the cathode and the anode of the photodiode 10 during saturation and desaturation of voltage output V2.

Therefore, in the embodiment of FIG. 8, optional additional compensation may be accomplished by monitoring the photodiode anode voltage V(anode) and subtracting it from the output voltage V3.

More specifically, the output of the buffer 38 may be used as a compensation signal V3c which at least partly reproduces the measurement error present on the output voltage V3. The compensation signal V3c (=V(anode)) may then be subtracted from the output voltage V3 using a subtraction circuit 46/3 to reduce measurement distortions and produce a corrected output voltage V3'.

FIGS. 11A, 11B and 11C show simulation results for the embodiment of FIG. 8, considering a scan speed of 500 nm/s on an optical component showing a slope of +/1000 dB/nm.

FIG. 11A represents the optical power at photodiode input. FIG. 11B represents the optical power as measured by the optical power meter of FIG. 8. Again, a delay was added to the optical power trace in order for the two traces to match on the abscissa axis.

FIG. 11C represents the measurement error as obtained from the difference between the traces of FIGS. 11A and 11B. It shows that the measurement error is reduced to about +/−50 mdB (e.g., +/−1.2%), a substantial improvement compared to the measurement error shown in FIG. 3C (about 0.9 dB peak to peak).

Figure 12A:
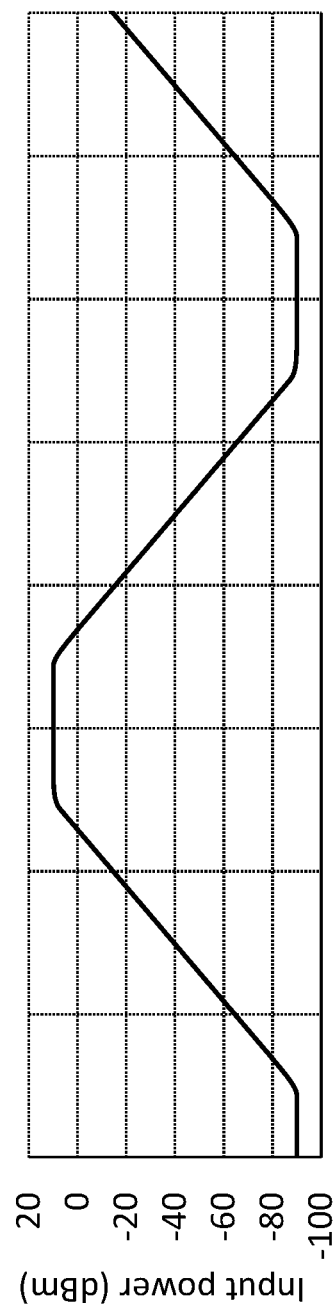
Figure 12B:
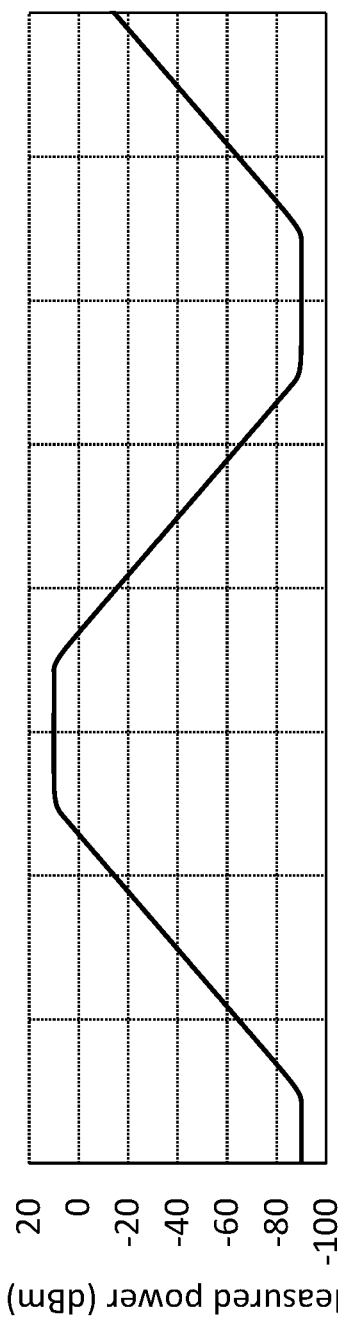
Figure 12C:
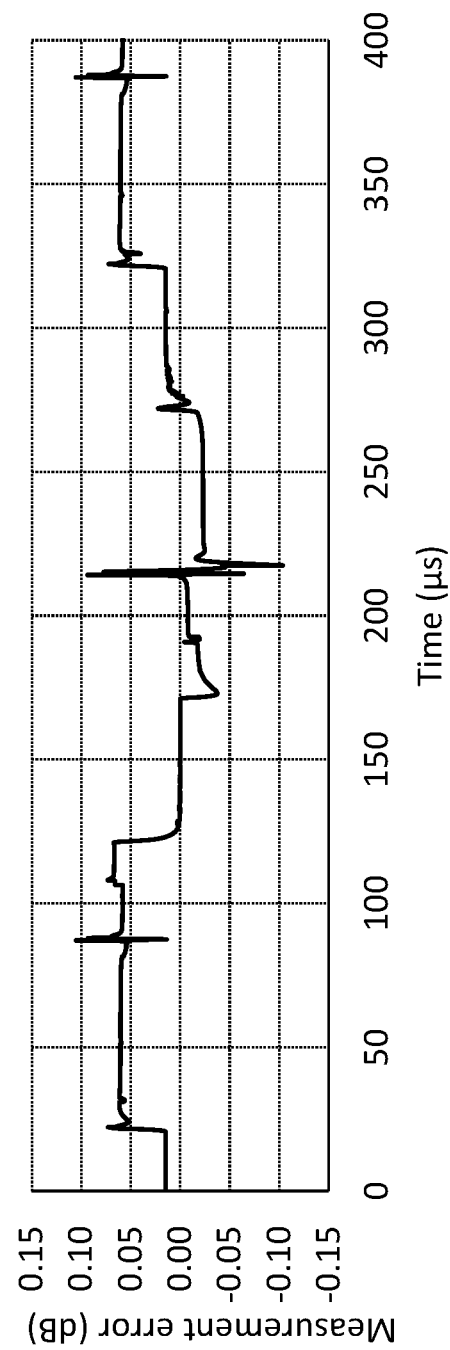

FIGS. 12A, 12B and 12C show simulation results for the embodiment of FIG. 8, considering a scan speed of 1000 nm/s on an optical component showing a slope of +/−1000 dB/nm.

FIG. 12A represents the optical power at photodiode input. FIG. 12B represents the optical power as measured by the optical power meter of FIG. 8. Again, a delay was added to the optical power trace in order for the two traces to match on the abscissa axis.

FIG. 12C represents the measurement error as obtained from the difference between the traces of FIGS. 12A and 12B. In this case, the measurement error is about +/−100 mdB (e.g., +/−2.3%).

It should be further noted that an additional advantage of the optical power meter of FIG. 8 is its very low dependence on the equivalent capacitance of the photodiode, i.e., the same compensation signal generator circuit works for photodiode equivalent capacitance values varying between 0 to 200 pF.

Figure 13:
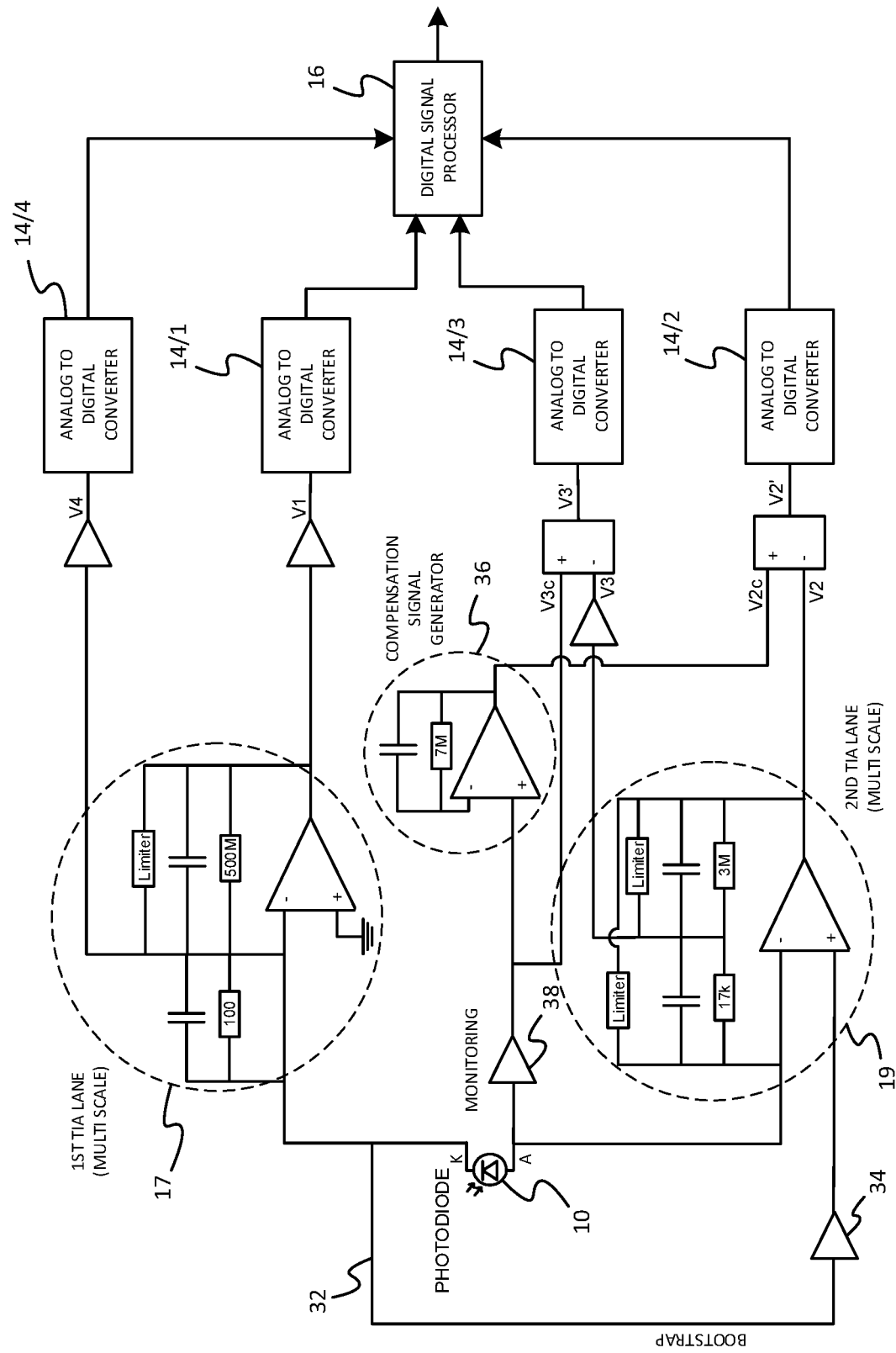
FIG. 13 is a schematic illustrating an optical power meter comprising a multiscale amplification circuit in accordance with one embodiment having two dual-scale transimpedance amplification lanes, a bootstrap and a compensation signal generator.

FIG. 13 shows an optical power meter in accordance with another embodiment, which also comprises a bootstrap circuit 32 and a compensation signal generator circuit 36. The configuration of the optical power meter of FIG. 13 is similar to that of FIG. 8, except that the amplification circuit comprises two dual-scale TIA lanes 17, 19. These two dual-scale TIA lanes are used to further extend the effective dynamic range of an optical power acquisition circuit. Equivalent features will therefore not be repeatedly described.

The first TIA lane 17 and the second TIA lane 19 each comprise two gain scales. The first TIA lane 17 produces output voltage V1 and output voltage V4 and the second TIA lane 19 produces output voltage V2 and output voltage V3, all proportional (with mutually different constants of proportionality) to the electrical current produced by the photodiode detector.

In the embodiment of FIG. 13, measurement distortions are reduced on output voltage V2' using the compensation signal generator circuit 36 which monitors the photodiode voltage (here on the anode thereof) to produce a compensation signal V2c that is then subtracted from output voltage V2.

In addition, similar to the amplification circuit of FIG. 8, optional additional compensation may be accomplished by monitoring the photodiode anode voltage V(anode) and subtracting it from the output voltage V3. More specifically, the compensation signal V3c (=V(anode)) may be subtracted from the output voltage V3 to reduce measurement distortions and produce a corrected output voltage V3'.

The embodiments described above are intended to be exemplary only and one skilled in the art will recognize that numerous modifications can be made to these embodiments without departing from the scope of the invention. For example, the bootstrap-compensator combo could be used with varied amplification configurations having multiple amplification lanes. Each lane could be single scale or multiscale.

The embodiments described above are intended to be exemplary only. The scope of the invention is therefore intended to be limited solely by the appended claims.

The invention claimed is:

1. An optical power measurement circuit comprising:
a photodiode detector to produce an electrical current dependent upon an intensity of light incident thereupon;
a first linear transimpedance amplification lane comprising a first transimpedance operational amplifier producing a first output voltage proportional to the electrical current produced by the photodiode detector in accordance with a first gain value;
a second linear transimpedance amplification lane comprising a second transimpedance operational amplifier producing a second output voltage proportional to the electrical current produced by the photodiode detector in accordance with a second gain value which is different from the first gain value;
a bootstrap circuit connected to suppress a voltage across the photodiode detector;
a compensation signal generator circuit configured to monitor the voltage on the photodiode detector and produce a first compensation signal proportional to distortions on the photodiode electrical current; and
a first subtraction circuit connected to the compensation signal generator circuit and the second linear transimpedance amplification lane so as to subtract the first compensation signal from the second output voltage of the second linear transimpedance amplification lane and thereby reduce measurement distortions.

2. The optical power measurement circuit as claimed in claim 1,
wherein the second linear transimpedance amplification lane is multiscale and comprises a second gain scale and a third gain scale to respectively produce the second output voltage and a third output voltage in accordance with a third gain value which is different from that of the first and the second gain values;
wherein the compensation signal generator circuit is configured to further produce a second compensation signal proportional to distortions on the photodiode current; and
the optical power measurement circuit further comprising a second subtraction circuit connected to the compensation signal generator circuit and the second linear transimpedance amplification lane so as to subtract the second compensation signal from the third output voltage of the second linear transimpedance amplification lane and thereby reduce the measurement distortions.

3. The optical power measurement circuit as claimed in claim 2, wherein the first and the second linear transimpedance amplification lanes are respectively connected to a cathode and an anode of the photodiode detector.

4. The optical power measurement circuit as claimed in claim 2, wherein the first gain value is greater than the second and the third gain values.

5. The optical power measurement circuit as claimed in claim 1, wherein the bootstrap circuit comprises a buffer, configured to feed the input of the first transimpedance operational amplifier to the noninverting input port of the second transimpedance operational amplifier.

6. The optical power measurement circuit as claimed in claim 1, wherein the first and the second transimpedance operational amplifier each comprise an operational amplifier having a feedback circuit connected between the output port and the inverting input port of the operational amplifier and comprising a feedback resistor, a feedback capacitor and a feedback limiter circuit connected in parallel.

7. The optical power measurement circuit as claimed in claim 4, the compensation signal generator circuit comprises an operational amplifier having a feedback circuit connected between the output port and the inverting input port of the operational amplifier and receiving the monitored photodiode voltage on the noninverting input port, the feedback circuit comprising a feedback resistor and a feedback capacitor connected in parallel.

8. The optical power measurement circuit as claimed in claim 2,
wherein the first transimpedance operational amplifier comprises an operational amplifier having a feedback circuit comprising a feedback resistor, a feedback capacitor and a feedback limiter circuit connected in parallel; and
wherein the second transimpedance operational amplifier comprises an operational amplifier having a feedback circuit comprising a first feedback resistor in parallel with a first feedback capacitor and a second feedback resistor in parallel with second feedback capacitor, and a feedback limiter circuit, wherein the third output voltage is extracted between the first and the second feedback resistors.

9. An optical power meter comprising:
the optical power measurement circuit as claimed in claim 1;
a first and a second analog-to-digital converter receiving the first output voltage and the second output voltage, to produce digital signals representative thereof; and
a digital signal processor to process the digital signals to produce a digital optical power measurement signal proportional to the electrical current of the photodiode detector.

10. A method for measuring optical power comprising:
using a photodiode detector, producing an electrical current dependent upon an intensity of light incident thereupon;
using a first linear transimpedance amplification lane comprising a first transimpedance operational amplifier, converting the electrical produced by the photodiode detector into a first output voltage proportional to the electrical current in accordance with a first gain value;
using a second linear transimpedance amplification lane comprising a second transimpedance operational amplifier, converting the electrical produced by the photodiode detector into a second output voltage proportional to the electrical current in accordance with a second gain value which is different from the first gain value;
using a bootstrap circuit, suppressing a voltage across the photodiode detector;
using a compensation signal generator circuit, monitoring the voltage on the photodiode detector and producing a first compensation signal proportional to distortions on the photodiode electrical current; and using a first subtraction circuit, subtracting the first compensation signal from the second output voltage of the second linear transimpedance amplification lane to thereby reduce measurement distortions.

11. The method as claimed in claim 10, wherein the second linear transimpedance amplification lane is multi-scale and comprises a second gain scale and a third gain scale and wherein the method further comprises:

using said second linear transimpedance amplification lane, converting the electrical produced by the photodiode detector into a third output voltage proportional to the electrical current in accordance with a third gain value which is different from that of the first and the second gain values;

using the compensation signal generator circuit, producing a second compensation signal proportional to distortions on the photodiode current; and using a second subtraction circuit, subtracting the second compensation signal from the third output voltage of the second linear transimpedance amplification lane to thereby reduce measurement distortions.

12. The method as claimed in claim 11, wherein the first gain value is greater than the second and the third gain values.

* * * * *